United States Patent
Shibatani (10) Patent No.: US 7,547,867 B2
(45) Date of Patent: Jun. 16, 2009

(54) POSITIONING DEVICE AND POSITIONING METHOD

(75) Inventor: Kazuhiro Shibatani, Sakai (JP)

(73) Assignee: Konica Minolta Opto, Inc., Tokyo (JP)

( * ) Notice: Subject to any disclaimer, the term of this patent is extended or adjusted under 35 U.S.C. 154(b) by 0 days.

(21) Appl. No.: 12/074,014

(22) Filed: Feb. 28, 2008

(65) Prior Publication Data
US 2008/0212108 A1    Sep. 4, 2008

(30) Foreign Application Priority Data
Mar. 1, 2007   (JP)   ............................. 2007-051105
Mar. 1, 2007   (JP)   ............................. 2007-051107

(51) Int. Cl.
*G02B 7/04*   (2006.01)
*G03B 13/00*  (2006.01)

(52) U.S. Cl. ..................... 250/201.2; 348/345; 356/614

(58) Field of Classification Search .............. 250/201.2, 250/201.4, 201.5; 348/345, 351, 354; 396/80, 396/82; 356/609, 614, 624
See application file for complete search history.

(56) References Cited
U.S. PATENT DOCUMENTS
2007/0273783 A1* 11/2007 Okazaki et al. ............. 348/345
2008/0165274 A1* 7/2008 Toguchi ...................... 348/354

FOREIGN PATENT DOCUMENTS
JP        2003-338795        11/2003

* cited by examiner

*Primary Examiner*—Kevin Pyo
(74) *Attorney, Agent, or Firm*—Brinks Hofer Gilson & Lione (57) ABSTRACT

A positioning method for positioning a movable member so as to maximize a detection output of a position detecting means whose detection output varies corresponding to positions of the movable member, comprising: performing a wobbling control when the detection output is small, in which the movable member is moved forward and backward by a predetermined minute amount, and the movable member is moved in proportion to a difference between the detection output when the movable member is moved forward by the predetermined minute amount and the detection output when the movable member is moved backward; and performing a hill climbing control when the detection output is large, in which the movable member is moved in one direction by only a predetermined adjustment amount and when the detection output increases, the movable member is moved again in an identical direction by the adjustment amount.

14 Claims, 8 Drawing Sheets

POSITIONING DEVICE AND POSITIIONING METHOD

This application is based on applications No. 2007-051105 and No. 2007-051107 filed in Japan, the contents of which are hereby incorporated by reference.

BACKGROUND OF THE INVENTION

The present invention relates to a positioning device and a positioning method.

A laser device is described, for example, in JP 2003-338795 A in which a laser beam emitted from a light projection section such as laser oscillators is aligned with and guided to a light receiving member such as optical fibers with use of optical members (movable members) such as lenses. In JP 2003-338795 A, the laser beam is positioned with respect to an optical fiber with a technique called wobbling in which the optical member is minutely vibrated with fixed amplitude and the change in intensity of the laser beam in the optical fiber is measured to detect the amount of center displacement of the laser beam so that the optical member is moved to the position where the received light intensity of the laser beam is maximized.

In the case of driving a movable member with a friction drive-type actuator, a difference may arise in the displacement amount of the movable member depending on driving directions. In that case, even when drive voltage is applied so that the movable member is moved forward and then backward so that it may return to the first position, the actual movable member moves to a position slightly displaced from the first position. This slight displacement leads to an error of wobbling, thereby causing such problems as the necessity of repeating a number of wobbling operations before accurate alignment is attained and the generation of offsets which cannot be eliminated depending gains of wobbling.

In such a laser device, a control method called hill climbing control is also known, the hill climbing control being composed of the steps for moving the optical member by a specified amount, checking whether or not the received light intensity increases, and moving the optical member continuously at a specified pitch in the direction of increasing the received light intensity until the increase in the received light intensity shifts to decrease. Although the hill climbing control enables more high precision alignment than the wobbling, it has a problem that positioning takes longer time than that in the wobbling.

The friction drive-type drive unit also has a problem in which repeated slide displacement in a minute area causes anomalous attrition in frictional contact sections, resulting in change of drive performance.

SUMMARY OF THE INVENTION

An object of the present invention is to provide, in view of the aforementioned problems, a positioning device and a positioning method which allow accurate positioning so as to maximize a detection output in a short period of time.

In order to accomplish the above objects, there is provided a positioning device in the present invention, including: a movable member moved by a drive unit; position detecting means position detecting means outputting a detection output which is maximized when the movable member is at a prescribed position; and control means which controls the drive unit corresponding to the detection output, wherein when the detection output is small, the control means performs wobbling control in which the movable member is first moved forward by only a predetermined minute amount, then backward by twice the minute amount, again forward by only the predetermined minute amount, and further in proportion to a difference between the detection output when the movable member is first moved forward by the predetermined minute amount and the detection output when the movable member is moved backward; and wherein when the detection output is large, the control means performs hill climbing control in which the movable member is moved in one direction by only a predetermined adjustment amount and when the detection output increases, the movable member is moved again in an identical direction by the adjustment amount.

According to this structure, the movable member can promptly be moved by wobbling control to the vicinity of a peak position where a detection output becomes maximum, and switching the control mode to hill climbing control in the vicinity of the peak position allows accurate positioning of the movable member at the peak position without producing offset.

According to the positioning device of the present invention, in the wobbling, the control means may determine that the detection output is small when either one of two determination conditions: AD1<AD2, AD2>AD3 and AD3<AD4; and AD1>AD2, AD2<AD3 and AD3>AD4 is satisfied, and determine that the detection output is large when neither of the determination conditions are satisfied, wherein AD1 represents the detection output before the movable member is first moved by a predetermined minute amount, AD2 represents the detection output when the movable member is first moved forward by only a predetermined minute amount, AD3 represents the detection output when the movable member is moved backward for only twice the predetermined minute amount, and AD4 represents the detection output when the movable member is again moved forward by only the predetermined minute amount.

According to this structure, only when the change in detection output relating to forward/backward movement of the movable member in the wobbling control is in monotone increase or monotone decrease in the displacement direction, the determination conditions are satisfied, and this makes it possible to check that the movable member moves over the vicinity of the peak of the detection output. Thus, by checking that the detection output reaches near the peak, it becomes possible to determine whether the detection output is close to a maximum value even when the rate of change of the detection output is small.

In the positioning device of the present invention, the control means may store the detection output before the movable member is first moved by a predetermined minute amount in the wobbling, and repeat correction operation, that is to move the movable member by only a predetermined correction amount in a direction which increases the detection output if the detection output at a time when the movable member is moved forward, backward and again forward is smaller by a predetermined threshold value or more than the detection output prior to the first movement of the movable member by a predetermined minute amount, and to move the movable member in a direction which decreases the detection output if the detection output is larger by the threshold value or more than the detection output prior to the first movement of the movable member by a predetermined minute amount, until a difference between the detection output and the detection output prior to the first movement of the movable member by a predetermined minute amount becomes less than the threshold value.

According to this structure, it becomes possible to correct the displacement due to the forward and backward movement in the wobbling control, decrease the deviation of a reference point of the movement of the movable member by the wobbling control, and to decrease the error of position accuracy.

In the positioning device of the present invention, the drive unit includes: a piezoelectric element which expands and contracts upon application of voltage; a vibrating member which has one end fixed to the piezoelectric element and which is reciprocally displaceable in an axial direction by expansion and contraction of the piezoelectric element; a friction engaging member which comes into frictional engagement with the vibrating member, holds the movable member, and is slidably displaceable with respect to the vibrating member by reciprocal movement of the vibrating member; and a drive circuit which applies a drive voltage to the piezoelectric element, wherein when the movable member is moved forward and backward by only the predetermined minute amount, the drive circuit may apply a predetermined voltage to the piezoelectric element in positive and negative directions while slowly changing the voltage so as to prevent slide displacement of the friction engaging member with respect to the vibrating member.

According to this structure, in the wobbling in which the movable member is moved forward and backward by a minute amount and the drive amount is defined corresponding to the change in the detection outputs, the movement of minute amount is achieved not by sliding movement of the friction engaging member with respect to the vibrating member but by minute movement of the movable member held by the friction engaging member by extension and contraction of the piezoelectric element. In this case, since the friction engaging member does not slidably move, there is no difference in movement amounts in different driving directions, so that the movement amount of the movable member required to maximize a detection output can correctly be computed.

Also in the positioning device of the present invention, if the predetermined voltage of the positive direction and the negative direction is applied as a peak of a sine wave, it is easy to decrease the rate of change in voltage and to suppress the slide displacement of the friction engaging member.

In the positioning device of the present invention, when the predetermined voltage of the positive direction and the negative direction is applied, limitation resistance may be connected to the piezoelectric element in series, so that the limitation resistance delays the charging operation of the piezoelectric element, thereby achieving slow drive change. In that case, the drive circuit can be easily structured as a full bridge circuit having two charge switches which respectively connect both electrodes of the piezoelectric element to a power supply, and two discharge switches which ground both the electrodes to a ground.

In the positioning device of the present invention, the predetermined voltage of the positive direction and the negative direction may be applied while being changed in stages so that a momentary voltage change may be less than a minimum starting voltage that is a minimum voltage of a step input which slidably moves the friction engaging member with respect to the vibrating member.

In that case, the drive circuit may be a full bridge circuit composed of a power supply having a voltage of ½ or more of the minimum starting voltage and a voltage of less than the minimum starting voltage, two charge switches which respectively connect both the electrodes of the piezoelectric element to the power supply, and two discharge switches which ground both the electrodes to a ground, so that the voltage applied to the piezoelectric element can be changed in stages of zero, positive supply voltage, zero, negative supply voltage and zero by turning on the discharge switch and then turning on the charge switch after a delay. Consequently, it becomes possible to reduce the voltage change to the minimum starting voltage or less, and to perform accurate wobbling operation. For slide displacement of the friction engaging member, the drive voltage exceeding the minimum starting voltage can be applied to the piezoelectric element by turning on the charge switch and the discharge switch simultaneously.

In the positioning device of the present invention, if an end section of the piezoelectric element opposite to the vibrating member is fixed to a weight, the reciprocal displacement of the vibrating member is increased by the inertia force of the weight, which makes it possible to increase the slide displacement of the friction engaging member.

According to the present invention, there is further provided a positioning method for positioning a movable member moved by a drive unit so as to maximize a detection output of a position detecting means whose detection output varies corresponding to positions of the movable member, the method including: performing a wobbling control when the detection output is small, in which the movable member is first moved forward by only a predetermined minute amount, then backward by twice the minute amount, again forward by only the predetermined minute amount, and further in proportion to a difference between the detection output when the movable member is first moved forward by the predetermined minute amount and the detection output when the movable member is moved backward; and performing hill climbing control when the detection output is large, in which the movable member is moved in one direction by only a predetermined adjustment amount and when the detection output increases, the movable member is moved again in an identical direction by the adjustment amount.

According to the present invention, the movable member can promptly be moved to near the peak position of a detection output by wobbling control, and from near the peak position, the positioning member is positioned at an accurate peak position by hill climbing control, so that accurate positioning can be performed in a short time.

BRIEF DESCRIPTION OF THE DRAWINGS

These and other objects and features of the present invention will become apparent from the following description taken in conjunction with the preferred embodiments thereof with reference to the accompanying drawings, in which.

DETAILED DESCRIPTION OF THE INVENTION

Figure 1:
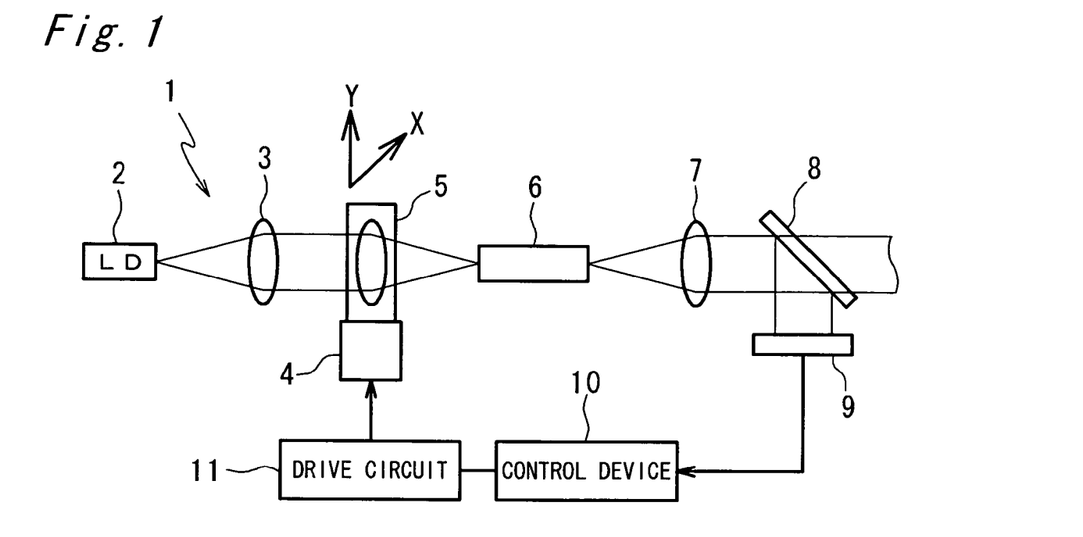
FIG. 1 is a schematic view of a positioning device in a first embodiment of the present invention.

FIG. 1 shows a positioning device 1 in a first embodiment of the present invention. The positioning device 1 is composed of a laser diode 2 which generates a laser beam, a fixed projection lens 3, a movable lens (movable member) 5 movable with a drive unit 4 in X and Y two directions which intersect a laser beam, a second harmonic generation element 6 into which a laser beam comes incident via the projection lens 3 and the movable lens 5, an emission lens 7 which emits an output of the second harmonic generation element 6, a half mirror 8 which separates the output of the second harmonic generation element 6, a power monitor (position detecting means) 9 which converts the level of the separated output of the second harmonic generation element 6 into a voltage signal (detection output), a control device (control means) 10 which moves the movable lens 5 with the drive unit 4 in a X-Y direction corresponding to a detection output of the power monitor 9, and a drive circuit 11 which is controlled by the control device 1 and applies a drive voltage to the drive unit 4.

The diameter of a light receiving section of the second harmonic generation element 6 is about 1 to 3 micrometers. The movable lens 5 condenses a laser beam so that it may have a diameter similar to that of the light receiving section of the second harmonic generation element 6, while aligning the optical axis of a laser beam with the center of the light receiving section of the second harmonic generation element 6.

In the case where the optical axis of a laser beam is in alignment with the center of the second harmonic generation element 6 by means of the movable lens 5, the entire energy of a laser beam is inputted into the second harmonic generation element 6, which maximizes the output of the second harmonic generation element 6 and which also maximizes the detection output of the power monitor 9.

Figure 2:
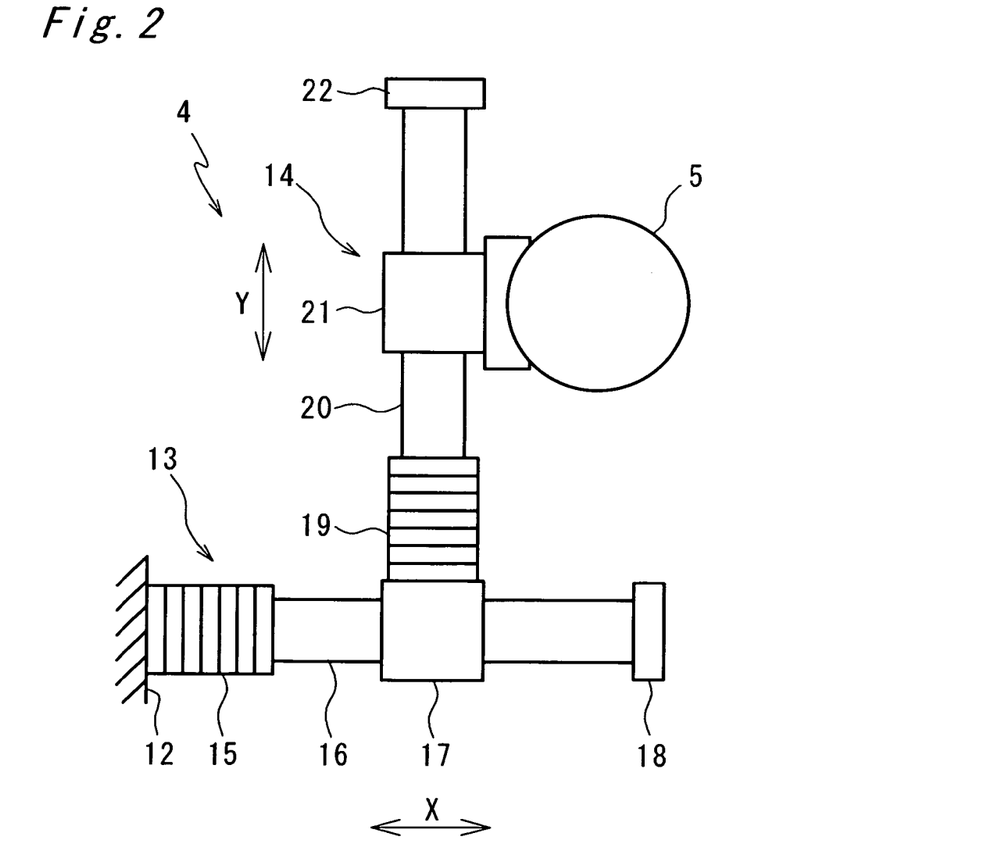
FIG. 2 is a schematic view of a drive unit of the positioning device in FIG. 1.

The structure of the drive unit 4 for moving the movable lens 5 is shown in FIG. 2. The drive unit 4 is composed of an X-axis actuator 13 fixed to a casing 12, and a Y-axis actuator 14 which is moved in an X axis direction by the X-axis actuator 13 to move the movable lens 5 in a Y axis direction.

The X-axis actuator 13 is composed of an X-axis piezoelectric element 15 which has one end fixed to the casing 12 and which expands and contracts in the X axis direction upon application of voltage, an X-axis vibrating member 16 which reciprocally moves in the X axis direction by expansion and contraction of the X-axis piezoelectric element 15, an X-axis friction engaging member 17 which comes into frictional engagement with the X-axis vibrating member 16, and an X-axis stopper 18 provided at the top end of the X-axis vibrating member 16. The Y-axis actuator 14 is composed of a Y-axis piezoelectric element 19 which has one end fixed to the X-axis friction engaging member 17 and which expands and contracts in the Y axis direction upon application of voltage, a Y-axis vibrating member 20 which reciprocally moves in the Y axis direction by expansion and contraction of the Y-axis piezoelectric element 19, a Y-axis friction engaging member 21 which comes into frictional engagement with the Y-axis vibrating member 20, and a Y-axis stopper 22 provided at the top end of the Y-axis vibrating member 20, with the Y-axis friction engaging member 21 holding the movable lens 5. The X-axis friction engaging member 17 is movable in a movable range between the X-axis piezoelectric element 15 and the X-axis stoppers 18, while the Y-axis friction engaging member 21 is movable in a movable range between the Y-axis piezoelectric element 19 and the Y-axis stoppers 22.

Figure 3:
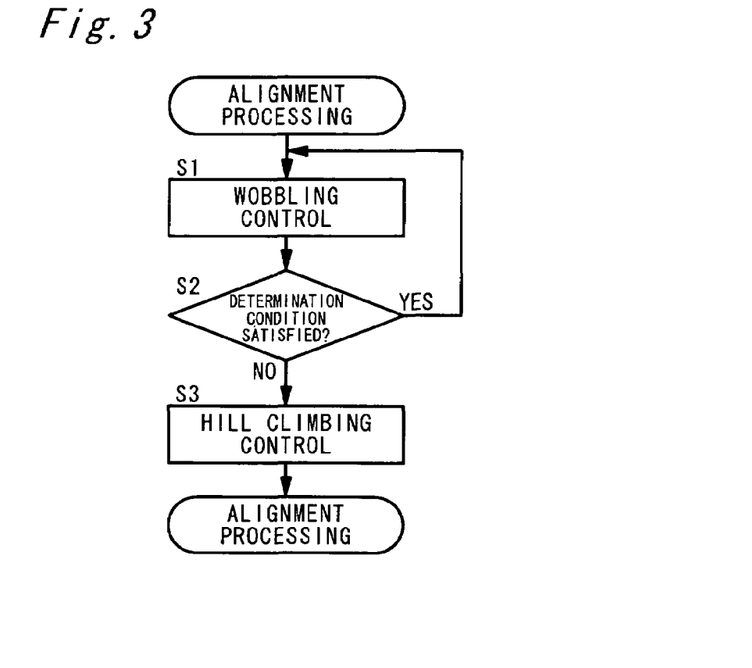
FIG. 3 is a control flowchart of the positioning device in FIG. 1.

FIG. 3 shows the flow of control of the drive unit 4 by the control device 10 in the positioning device 1. First, the control device 10 performs wobbling control in Step S1.

Figure 4:
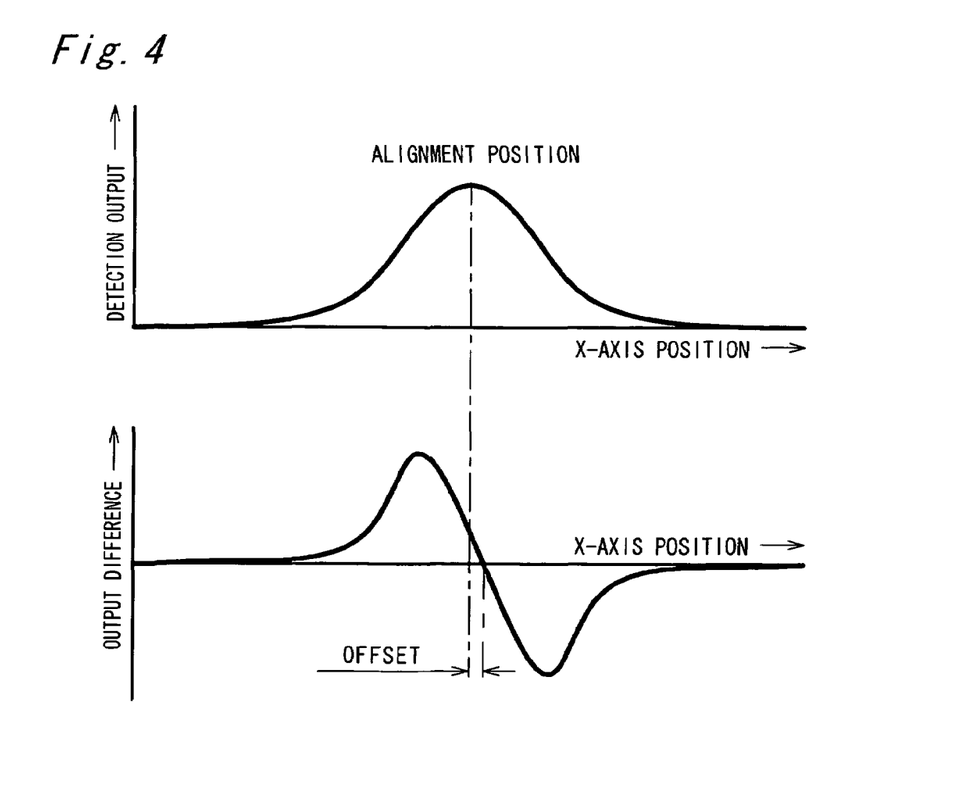
FIG. 4 is showing an example of driving a movable lens by the wobbling control in the positioning device of FIG. 1.

An example of wobbling control is shown in FIG. 4. Although wobbling control is repeated both in the X-axis and the Y-axis directions, FIG. 4 shows the wobbling control in the X-axis direction. When the initial position of the movable lens 5 is P1, the value of a detection output at this point is set to AD1. The control device 10 stores the detection output AD1 when the movable lens 5 is at the initial position P1.

In the wobbling control, the control device 10 first applies a drive voltage (e.g., two pulses with a duty ratio of 0.7), which moves the movable lens 5 by only a predetermined minute amount in the forward direction, to the X-axis actuator 13. The resultant position of the movable lens 5 is stored as P2 and a detection output therein as AD2. Then, the control device 10 applies a drive voltage (e.g., four pulses with a duty ratio of 0.3), which moves the movable lens 5 by only twice the predetermined minute amount in the backward direction, to the X-axis actuator 13, and stores the position of the movable lens 5 as P3 and a detection output as AD3. Further, the control device 10 applies a drive voltage (e.g., two pulses with a duty ratio of 0.7), which moves the movable lens 5 in the forward direction by only a predetermined minute amount, to the X-axis actuator 13 again, and stores the position of the movable lens 5 as P4 and a detection output as AD4.

In wobbling control, the control device 10 computes the drive amount of the movable lens 5 based on a difference (AD2-AD3) between the detection output AD2 in the case where the movable lens 5 is in the position P2 and the detection output AD3 in the position P3. In the present embodiment, prior to this computation, the position of the movable lens 5 is corrected.

Although P1 and P4 coincide in theory, the drive amount of the X-axis actuator 13 per one pulse in the forward direction and the drive amount per one pulse in the backward direction do not coincide in actuality, which causes displacement between P1 and P4, thereby generating a difference between the detection outputs AD1 and AD4. In the present embodiment, when the difference between these detection outputs AD1 and AD4 is beyond a predetermined threshold value, a drive voltage of a minimum drive amount (one pulse with a duty ratio of 0.3 or 0.7) is applied so as to drive the movable lens 5 in the direction of decreasing the difference, i.e., in the direction of increasing the detection output if AD1 is large, and in the direction of decreasing the detection output if AD1 is small. Further, the detection output after the movement is checked, and if the difference from AD1 is beyond the threshold value, then application of the drive voltage of the minimum drive amount is repeated.

Thus, after the position of the movable lens 5 is corrected, the drive voltage to drive the movable lens for an amount obtained by multiplying the difference (AD2–AD3) between the detection outputs AD2 and AD3 by a specified coefficient is applied to the X-axis actuator 13. In this case, if the difference (AD2−AD3) is a positive value, then the drive voltage (a pulse with a duty ratio of 0.7) to move the movable lens 5 forward is applied, whereas if the difference (AD2−AD3) is a negative value, the drive voltage (a pulse with a duty ratio of 0.3) to move the movable lens 5 backward is applied.

Figure 5:
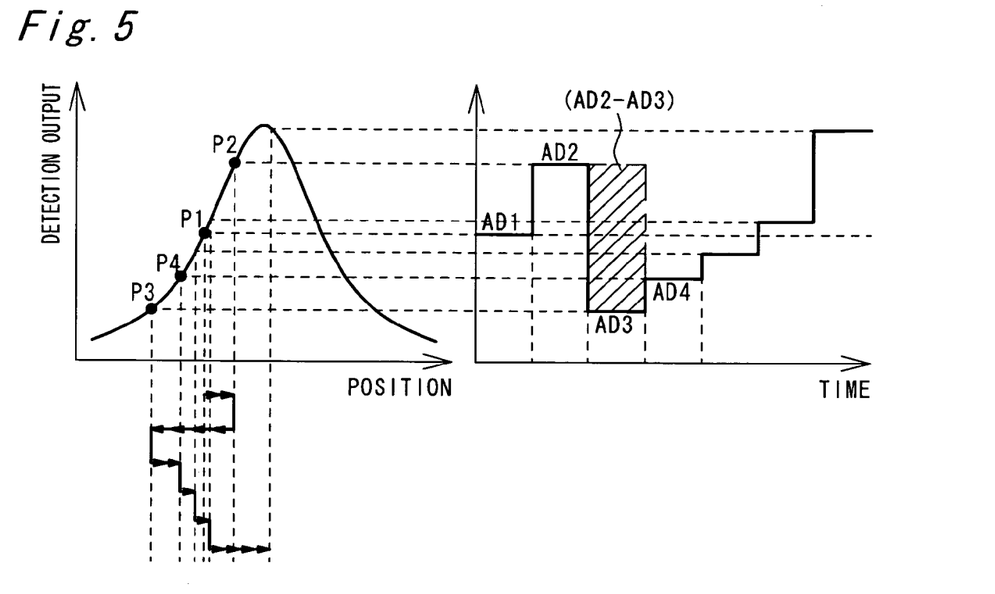
FIG. 5 is showing the relation between the profile of a detection output in the positioning device of FIG. 1 and a difference in the wobbling control.

FIG. 5 shows the relation among the position of the movable lens 5, the detection output and difference between the detection outputs AD2 and AD3. When the drive amount of the X-axis actuator 13 in the forward direction is different from that in the backward direction, the distance between P1 and P2 and the distance between P3 and P1 do not coincide. Consequently, as shown in the drawing, the position of P1 where a difference between the detection outputs becomes zero turns out to be a position which is offset from the position where the detection output in P1 becomes maximum.

Accordingly, in the present embodiment, when it is determined that the detection output is large and reaches in the vicinity of a peak in Step S2 in FIG. 3, the procedure proceeds to Step S3, where the movable lens 5 is positioned at a peak position without offset by hill climbing control.

In Step S2, if AD1<AD2, AD2>AD3 and AD3<AD4, then it is determined that P1, P2, P3, and P4 are in the range in which the detection output is in monotone increase, whereas if AD2<AD3 and AD3>AD4, then it is determined that P1, P2, P3, and P4 are in the range in which the detection output is in monotone decrease. If neither of these two determination conditions are satisfied, then it is determined that a peak of the detection output where the detection output becomes maximum exists between P2 and P3.

If the determination conditions are no longer satisfied in Step S2, the control device 10 positions the movable lens 5 in the position where the detection output becomes maximum by hill climbing control in Step S3.

Figure 6:
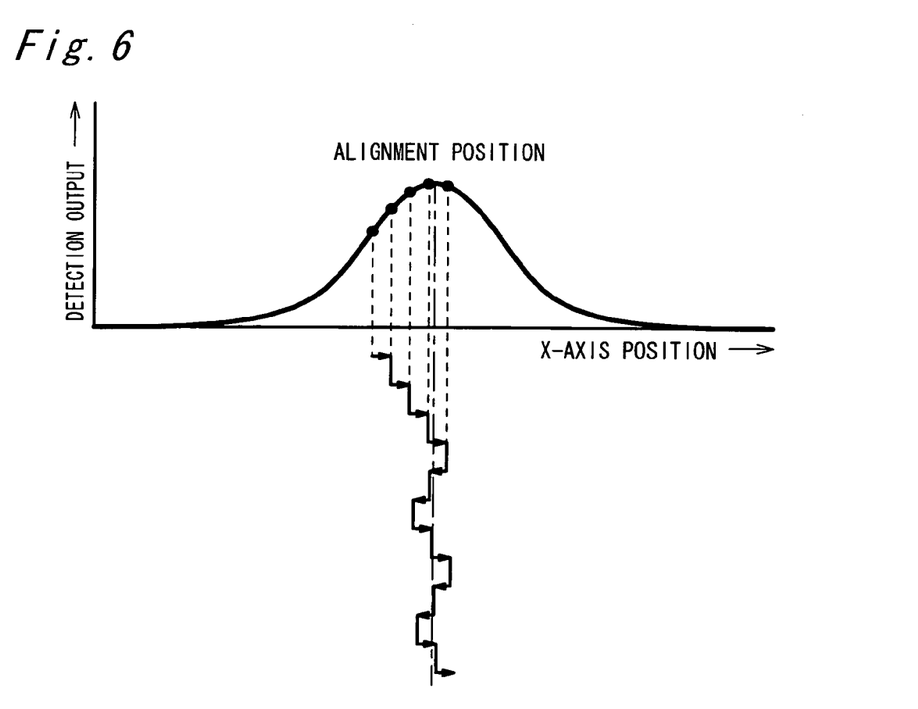
FIG. 6 is showing an example of driving a movable lens by the hill climbing control in the positioning device of FIG. 1.

An example of the hill climbing control is shown in FIG. 6. In the hill climbing control, the control device 10 applies a drive voltage (one pulse), which moves the movable lens 5 by only a minimum drive amount, to the X-axis actuator 13. The direction in which the movable lens 5 is moved is a forward direction if a difference (AD2−AD3) of the detection outputs in the last wobbling is positive and if the difference (AD2−AD3) of the detection outputs is negative, it is a backward direction.

If the detection output increases as a result of the movement of the movable lens 5 by only the minimum drive amount, the same drive voltage is applied, whereas if the detection output decreases, the drive voltage of an opposite direction is applied. Consequently, as shown in the drawing, the movable lens 5 approaches a peak position where the detection output becomes maximum, and once it passes the peak position, the movable lens 5 changes the direction and moves again to the peak position.

In the present embodiment, the hill climbing control is repeatedly performed during operation of the positioning device in order to ensure that the optical axis of a laser beam is aligned with the center of the second harmonic generation element 6. The same control is also applied to the Y axis direction.

Figure 7:
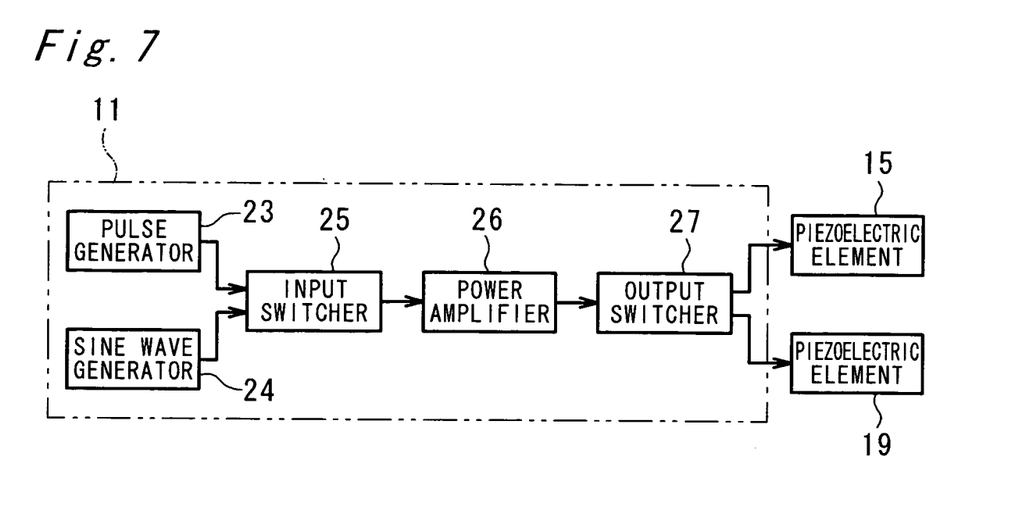
FIG. 7 is a structure view of a drive circuit of a positioning device in a second embodiment of the present invention.

FIG. 7 shows the structure of a drive circuit 11 of a positioning device in a second embodiment of the present invention. It is to be noted that the present embodiment is similar to the first embodiment except the drive circuit 11, and therefore redundant description is omitted. The drive circuit 11, which has a pulse generator 23 and a sine wave generator 24, selects an output of the pulse generator 23 or the sine wave generator 24 with an input switcher 25, amplifies the output with a power amplifier 26, and applies the amplified output to an X-axis piezoelectric element 15 or a Y-axis piezoelectric element 19 selected by an output switcher 27. The pulse generator 23 generates a drive voltage wave for slidably moving the friction engaging members 17 and 21 of the drive unit 4 with respect to the vibrating members 16 and 20. The sine wave generator 24 generates a sine wave with a long cycle compared with the pulse generated by the pulse generator 23.

Figure 8:
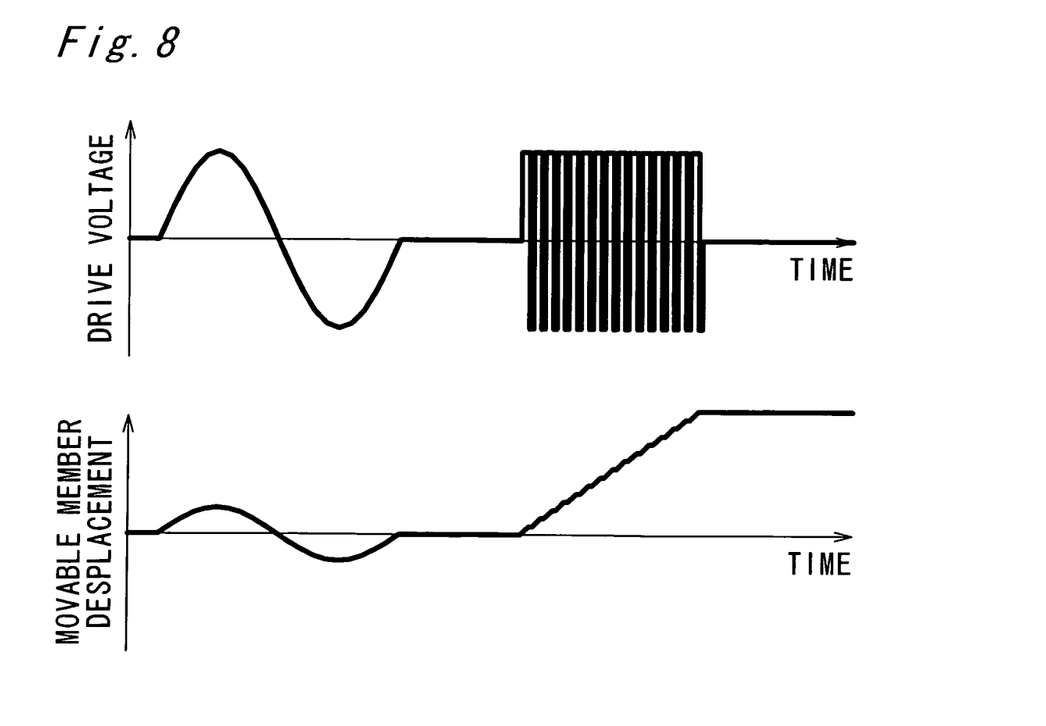
FIG. 8 is showing a drive voltage wave in wobbling of the positioning device of FIG. 7, and displacement of a movable member.

FIG. 8 shows the relation between a drive voltage wave outputted by the drive circuit 11 and displacement of the movable lens 5 when the drive voltage wave is applied to the drive unit 4. When a rectangular pulses wave generated by a pulse generator 23 is amplified with the power amplifier 26 and is applied to the piezoelectric elements 15 and 19, the friction engaging members 17 and 21 slidably move on the vibrating member 16 and 20 as in the first embodiment. However, when a sine wave generated by the sine wave generator 24 is amplified with the power amplifier 26 and is applied to the piezoelectric elements 15 and 19, the piezoelectric elements 15 and 19 expand and contract in the sine wave shape synchronized with the drive voltage, and thereby reciprocally displace the vibrating members 16 and 20 in the limited wave shape. In this case, the friction engaging members 17 and 21 are reciprocally displaced in a sine wave shape synchronized with the drive voltage in the state of being in frictional engagement with the vibrating members 16 and 20.

Figure 9:
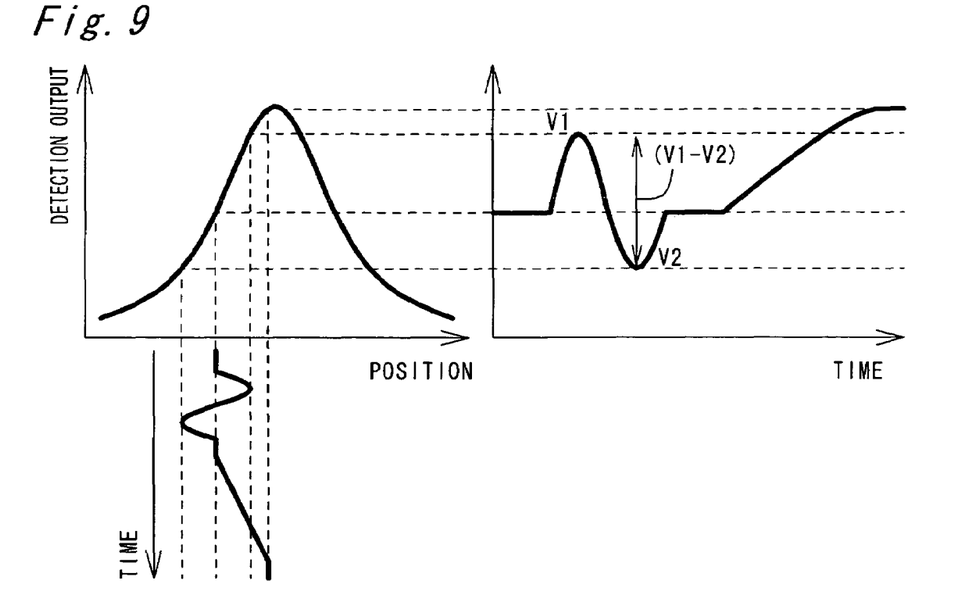
FIG. 9 is showing the relation between the profile of a detection output in the positioning device of FIG. 7 and a difference in the wobbling control.

In the first embodiment, in the wobbling, the drive amount of the drive unit 4 is defined by applying a predetermined pulse to the piezoelectric elements 15 and 19 so as to move the movable lens 5 by only a minute amount. However, in the present embodiment, as shown in FIG. 9, the control device 10 amplifies a sine wave generated by the sine wave generator 24 with the power amplifier 26, applies the amplified wave to the piezoelectric elements 15 and 19, checks a detection output V1 at the moment when the drive voltage becomes maximum and a detection output V2 at the moment when the drive voltage becomes minimum (negative maximum), and compute a difference thereof (V1−V2).

Next, the control device 10 operates the input switcher 25 of the drive circuit 11, and makes the pulse generator 23 output a number of pulses obtained by multiplying the difference of the detection outputs by a specified coefficient, which is computed when the drive voltage of the sine wave shape is applied, so that the wobbling for moving the movable lens 5 closer to a peak position where the detection output becomes maximum is performed.

In the present embodiment, a difference of detection outputs (V1−V2) is obtained by minutely moving the friction engaging members 17 and 21 which hold the movable lens 5 in both the forward direction and the backward direction by an identical amount through expansion and contraction of the piezoelectric elements 15 and 19 without sliding movement of the friction engaging members 17 and 21 with respect to the vibrating members 16 and 20. Accordingly, even if the driving force of the drive unit 4 in the forward direction is different from that in the backward direction, the minute movement for defining the movement amount in wobbling has no difference in the forward direction and the backward direction.

Also in the present embodiment, as shown in FIG. 3, hill climbing control may advantageously be performed to align the movable lens when the detection output exceeds a predetermined value. However, the wobbling operation in the present embodiment makes it possible to correctly detect the amount of displacement of the movable lens 5 from the peak detection output position, so that high-precision alignment is implemented only with the wobbling.

In the present embodiment, since the number of the sliding movements of the friction engaging members 17 and 21 on the vibrating member 16 and 20 can be reduced, the shortened service life and partial wear of the vibrating members 16 and 20 can be prevented.

Figure 10:
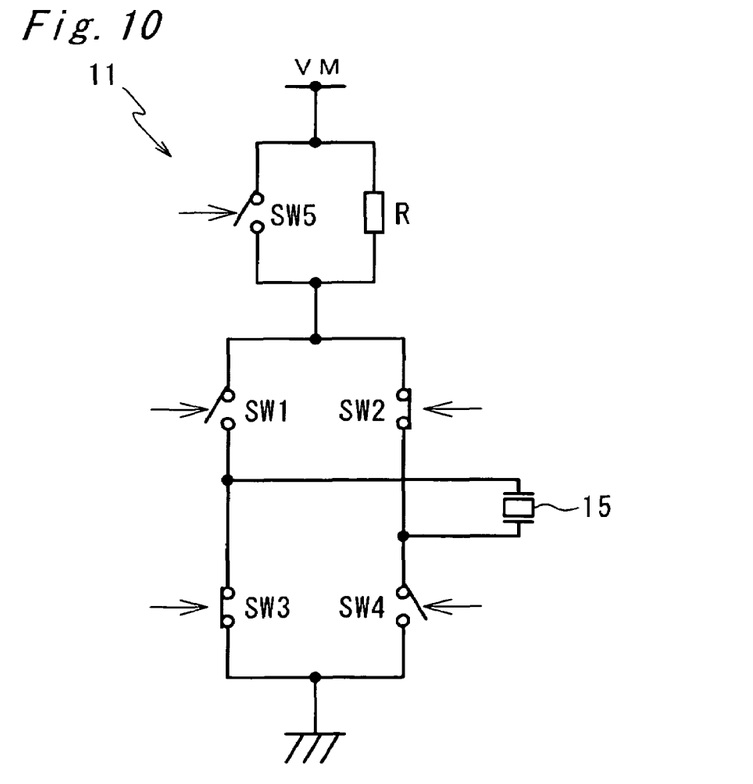
FIG. 10 is a circuit diagram of a drive circuit of a positioning device in a third embodiment of the present invention.

FIG. 10 shows a drive circuit 11 of a positioning device in a third embodiment of the present invention. Since the entire configuration of the positioning device in the present embodiment is similar to that in the first embodiment, redundant description is omitted.

The drive circuit 11 of the present embodiment is a full bridge circuit composed of charge switches SW1 and SW2 which connect both electrodes of the piezoelectric elements 15 and 19 to the power supply of a voltage VM(V), respectively, discharge switches SW3 and SW4 which ground both the electrodes of the piezoelectric elements 15 and 19 to a ground, respectively, and an insertion-switch SW5 which can insert a limitation resistance R in between the power supply VM and the charge switches SW1, SW2 by turning off.

The drive circuit 11 applies supply voltage VM(V) to the piezoelectric elements 15 and 19 in the positive direction by turning on the charge switch SW1 and the discharge switch SW4 simultaneously. The charge switch SW2 and the discharge switch SW3 operate in a reversed manner of the charge switch SW1 and the discharge switch SW4, that is, they apply supply voltage VM(V) to the piezoelectric elements 15 and 19 in the negative direction in the ON state. In short, voltage fluctuation of 2VM(V) is applied to the piezoelectric elements 15 and 19 by switching the charge switch SW1 and the discharge switch SW4, to and from the charge switch SW2 and the discharge switch SW3.

In the case of slidably moving the friction engaging members 17 and 21 of the drive unit 4 with respect to the vibrating members 16 and 20, the control device 10 closes the insertion-switch SW5 and operates the charge switch SW1, SW2 and the discharge switch SW3, SW4 with the limitation resistance R bypassed. In the case of moving the friction engaging member 17 and 21 which hold the movable lens 5 in the positive direction, the control device 10 turns on the charge switch SW1 and the discharge switch SW4 in a short cycle with a duty ratio of, for example, 0.7. In the case of moving the friction engaging members 17 and 21 in the positive direction, the duty ratio of the charge switch SW1 and the discharge switch SW4 is set to 0.3, for example.

When the positioning device of the present embodiment performs wobbling in which the movable lens 5 is minutely moved and its displacement amount from a peak position of the detection output is computed, the control device 10 opens the insertion-switch SW5, and inserts the limitation resistance R in between the power supply and the charge switches SW1, SW2. Then, the control device 10 turns on the charge switch SW1 and the discharge switch SW4 in a cycle sufficiently longer than that in the case of the sliding movement of the friction engaging members 17 and 21, that is, with a duty ratio of, for example, 0.5.

Figure 11:
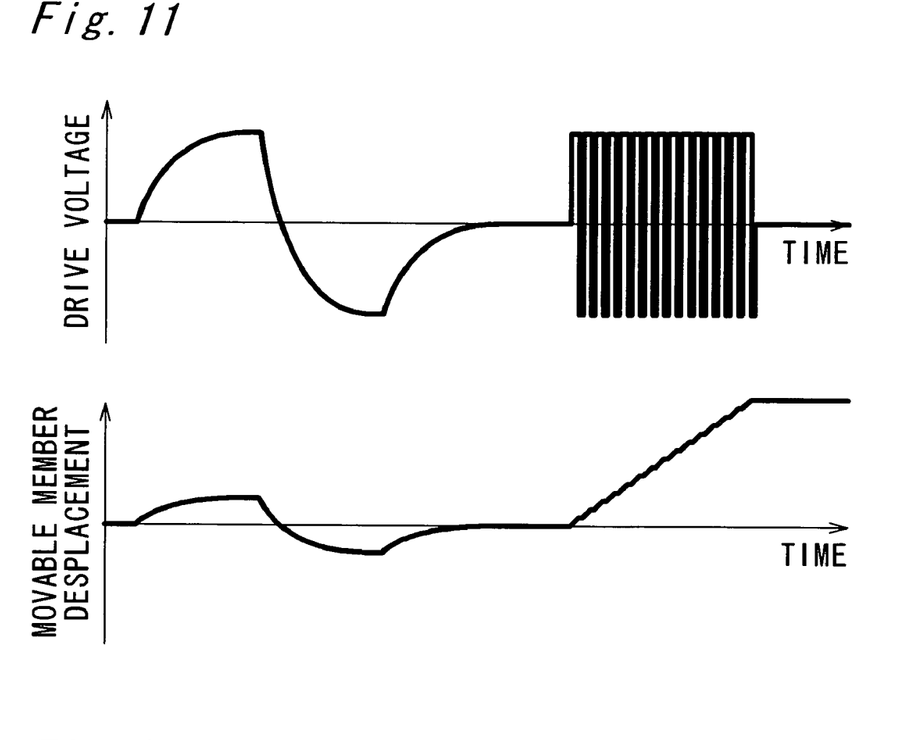
FIG. 11 is showing a drive voltage wave in wobbling of the positioning device of FIG. 10, and displacement of a movable member.

Since the piezoelectric elements 15 and 19 can electrically be regarded as equivalence of capacitors, an RC circuit is formed with the limitation resistance R inserted therein. As shown in FIG. 11, after the charge switch SW1 or SW2 is turned on, a drive voltage, which causes voltage change after the primary delay, is applied to the piezoelectric elements 15 and 19. As a result, the vibrating members 16 and 20 slowly expand and contract, so that the movable lens 5 is minutely moved forward and backward by the expansion and contraction of the piezoelectric elements 15 and 19 without sliding movement of the friction engaging members 17 and 21 with respect to the piezoelectric elements 15 and 19.

The control device 10 can compute the amount of displacement of the movable lens 5 from a peak position with sufficient accuracy by measuring detection outputs V1 and V2 at a timing which allows sufficient charging of the piezoelectric elements 15 and 19 (a timing which approximately maximize and minimize the drive voltage) and obtaining a difference (V1−V2) of the detection outputs.

Figure 12:
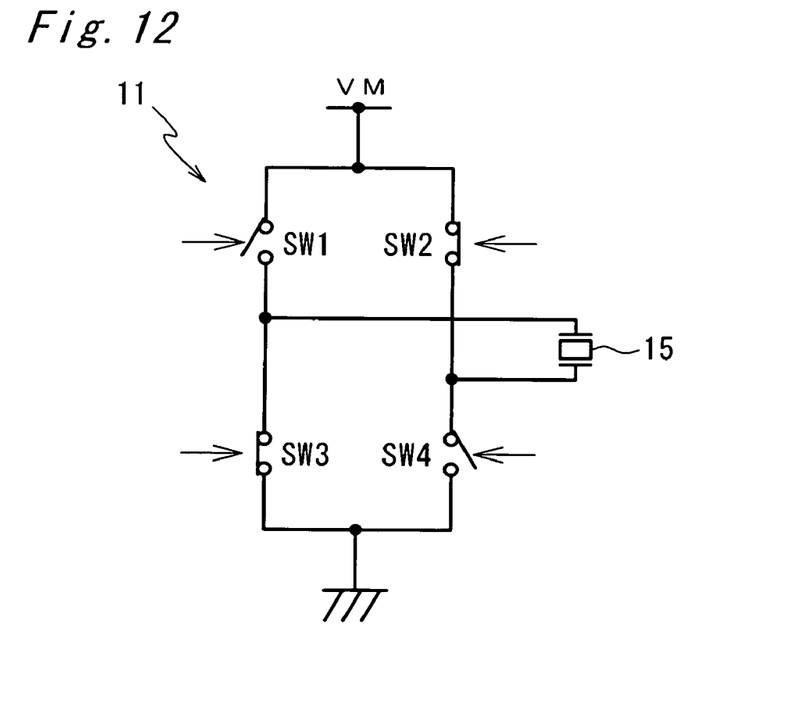
FIG. 12 is a circuit diagram of a drive circuit of a positioning device in a fourth embodiment of the present invention.

FIG. 12 shows the structure of a drive circuit 11 of a positioning device in a fourth embodiment of the present invention. Since the entire configuration of the positioning device in the present embodiment is similar to that in the first embodiment to the third embodiment, redundant description is omitted.

While the drive unit of the present embodiment is a full bridge circuit which is composed only of charge switches SW1, SW2 and discharge switches SW3, SW4, the supply voltage VM(V) is set to satisfy a condition of ½ Vmin<=VM<Vmin wherein Vmin(V) represents a minimum starting voltage of the drive unit 4. The minimum starting voltage Vmin is the lowest voltage which can slidably move the friction engaging members 17 and 21 with respect to the vibrating members 16 and 20 when a step shape drive voltage is inputted into the piezoelectric elements 15 and 19 of the drive unit 4.

In the present embodiment, the control device 10 drives the charge switch SW1, SW2 and the discharge switch SW3, SW4 for achieving the sliding movement of the friction engaging members 17 and 21 which hold the movable lens 5 with respect to the vibrating members 16 and 20 as in the second embodiment.

Figure 13:
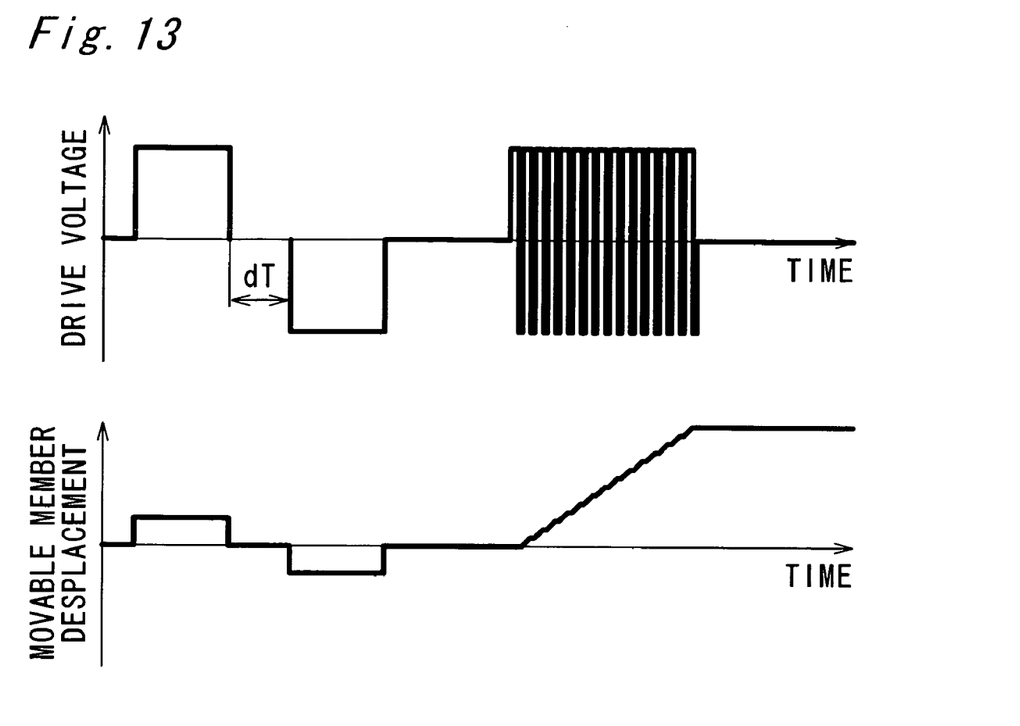
FIG. 13 is showing a drive voltage wave in wobbling of the positioning device of FIG. 12, and displacement of a movable member.

However, in the case of performing wobbling operation in which the movable lens 5 is minutely moved and the amount of displacement from a peak position of detection outputs is computed, the control device 10 first turns on the charge switch SW1 and the discharge switch SW4 to minutely move the movable lens 5 in the forward direction as shown in FIG. 13. Next, for minutely moving the movable lens 5 in the backward direction, the discharge switch SW3 is turned on at the moment the charge switch SW1 is turned off, and then after only a predetermined time delay dT, the discharge switch SW4 is turned off and the charge switch SW2 is turned on. In short, during the period of time from application of +VM(V) voltage to application of −VM(V) voltage to the piezoelectric elements 15 and 19, both the electrodes of the piezoelectric elements 15 and 19 are short-circuited for only the delay time dT for application of 0(V).

Controlling the drive circuit 11 in this way makes the momentary change of the drive voltages applied to the piezoelectric elements 15 and 19 smaller than the minimum starting voltage Vmin, respectively. Consequently, the minute movement of the movable lens 5 is achieved by expansion and contraction of the piezoelectric elements 15 and 19 without sliding movement of the friction engaging members 17 and 21 with respect to the vibrating members 16 and 20, thereby implementing accurate wobbling.

Depending on the structure of the drive circuit 11, it becomes possible to further increase the supply voltage VM by forming the drive voltage in wobbling operation into a multi-staged step-like wave.

Figure 14:
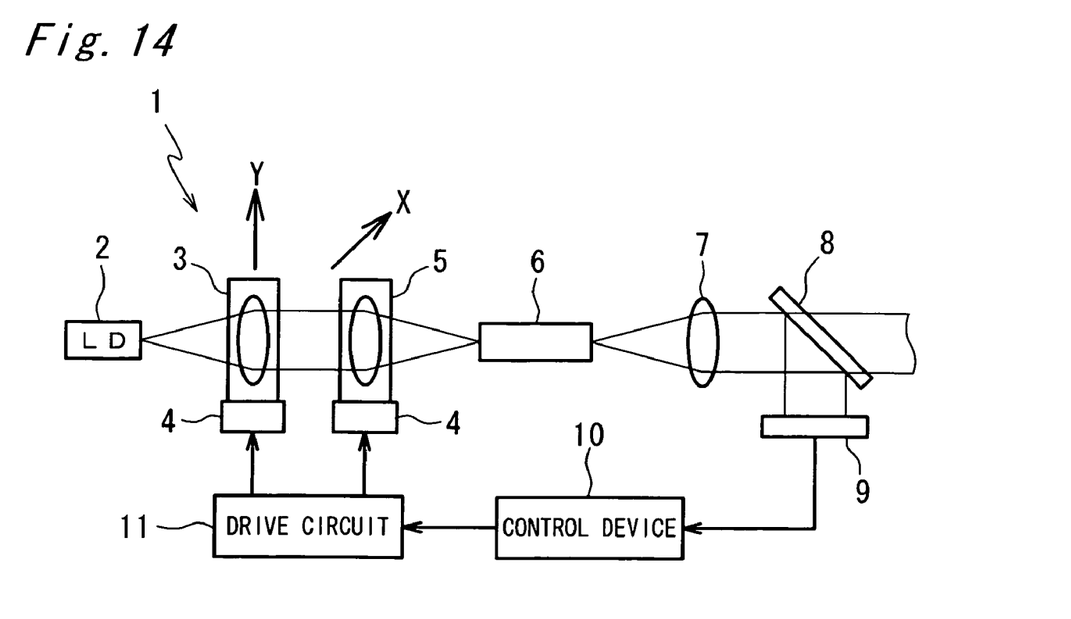
FIG. 14 is a schematic view of a positioning device in a fifth embodiment of the present invention.

It is to be noted that the present invention may be so structured that the projection lens 3 as a first movable member may be driven in the Y axis direction and the movable lens 5 as a second movable member is movable only in the X axis direction as in the fifth embodiment shown in FIG. 14.

Figure 15:
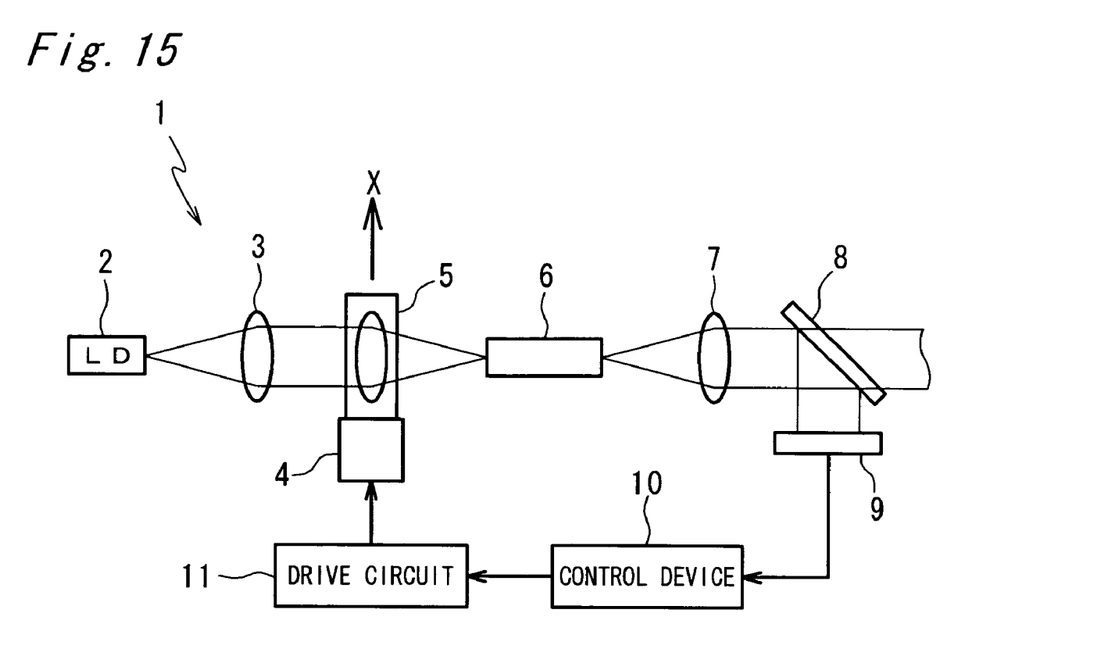
FIG. 15 is a schematic view of a positioning device in a sixth embodiment of the present invention.

Further, the present invention is also applicable to a positioning device movable only with respect to one axis as in the sixth embodiment shown in FIG. 15, and is further applicable to a positioning device which can be positioned with respect to three or more axes.

Moreover, the present invention is applicable not only to the alignment of a laser beam but also to returning an actuator to an original position based on, for example, the output of a Hall device. In this case, in the hill climbing control, it may be determined that the actuator reaches a peak position and returns to the original position when the detection output is decreased, at the point of which the control may be ended.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A positioning device, comprising:
a movable member moved by a-drive unit;
position detecting means outputting a detection output which is maximized when the movable member is at a prescribed position; and
control means which controls the drive unit corresponding to the detection output, wherein
when the detection output is small, the control means performs wobbling control in which the movable member is first moved forward by only a predetermined minute amount, then backward by twice the minute amount, again forward by only the predetermined minute amount, and further moved in proportion to a difference between the detection output when the movable member is first moved forward by the predetermined minute amount and the detection output when the movable member is moved backward, and wherein
when the detection output is large, the control means performs hill climbing control in which the movable member is moved in one direction by only a predetermined adjustment amount and when the detection output increases, the movable member is moved again in an identical direction by the adjustment amount.

2. The positioning device according to claim 1, wherein the drive unit comprises:
a piezoelectric element which expands and contracts upon application of voltage;
a vibrating member which has one end fixed to the piezoelectric element and which is reciprocally displaceable in an axial direction by expansion and contraction of the piezoelectric element;
a friction engaging member which comes into frictional engagement with the vibrating member, holds the movable member, and is slidably displaceable with respect to the vibrating member by reciprocal movement of the vibrating member; and
a drive circuit which applies a drive voltage to the piezoelectric element, wherein
when the movable member is moved forward and backward by only the predetermined minute amount, the drive circuit applies a predetermined voltage to the piezoelectric element in positive and negative directions while slowly changing the voltage so as to prevent slide displacement of the friction engaging member with respect to the vibrating member.

3. The positioning device according to claim 2, wherein the predetermined voltage of the positive direction and the negative direction is applied as a peak of a sine wave.

4. The positioning device according to claim 2, wherein when the predetermined voltage of the positive direction and the negative direction is applied, limitation resistance is connected to the piezoelectric element in series.

5. The positioning device according to claim 4, wherein the drive circuit is a full bridge circuit having two charge switches which respectively connect both electrodes of the piezoelectric element to a power supply, and two discharge switches which ground both the electrodes to a ground.

6. The positioning device according to claim 2, wherein the predetermined voltage of the positive direction and the negative direction is applied while being changed in stages so that a momentary voltage change may be less than a minimum starting voltage that is a minimum voltage of a step input which slidably moves the friction engaging member with respect to the vibrating member.

7. The positioning device according to claim 6, wherein
the drive circuit is a full bridge circuit composed of a power supply having a voltage of ½ or more of the minimum starting voltage and a voltage of less than the minimum starting voltage, two charge switches which respectively connect both the electrodes of the piezoelectric element to the power supply, and two discharge switches which ground both the electrodes to a ground, and wherein
the predetermined voltage of the positive direction and the negative direction is changed in stages by turning on the discharge switch and then turning on the charge switch after a delay.

8. The positioning device according to claim 2, wherein an end section of the piezoelectric element opposite to the vibrating member is fixed to a weight.

9. The positioning device according to claim 1, wherein
in the wobbling, the control means determines that the detection output is small when either one of two determination conditions: AD1<AD2, AD2>AD3 and AD3<AD4; and AD1>AD2, AD2<AD3 and AD3>AD4 is satisfied, and determines that the detection output is large when neither of the determination conditions are satisfied, wherein AD1 represents the detection output before the movable member is first moved by a predetermined minute amount, AD2 represents the detection output when the movable member is first moved forward by only a predetermined minute amount, AD3 represents the detection output when the movable member is moved backward by only twice the predetermined minute amount, and AD4 represents the detection output when the movable member is again moved forward by only the predetermined minute amount.

10. The positioning device according to claim 9, wherein the drive unit comprises:
a piezoelectric element which expands and contracts upon application of voltage;
a vibrating member which has one end fixed to the piezoelectric element and which is reciprocally displaceable in an axial direction by expansion and contraction of the piezoelectric element;
a friction engaging member which comes into frictional engagement with the vibrating member, holds the movable member, and is slidably displaceable with respect to the vibrating member by reciprocal movement of the vibrating member; and
a drive circuit which applies a drive voltage to the piezoelectric element, wherein
when the movable member is moved forward or backward by only the predetermined minute amount, the drive circuit applies a predetermined voltage to the piezoelectric element in positive and negative directions while slowly changing the voltage so as to prevent slide displacement of the friction engaging member with respect to the vibrating member.

11. The positioning device according to claim 1, wherein the control means stores the detection output before the movable member is first moved by a predetermined minute amount in the wobbling, and repeats correction operation, that is to move the movable member by only a predetermined correction amount in a direction which increases the detection output if the detection output at a time when the movable member is moved forward, backward and again forward is smaller by a predetermined threshold value or more than the detection output prior to the first movement of the movable member by a predetermined minute amount, and to move the movable member in a direction which decreases the detection output if the detection output is larger by the threshold value or more than the detection output prior to the first movement of the movable member by a predetermined minute amount, until a difference between the detection output and the detection output prior to the first movement of the movable member by a predetermined minute amount becomes less than the threshold value.

12. The positioning device according to claim 11, wherein the drive unit comprises:

a piezoelectric element which expands and contracts upon application of voltage;

a vibrating member which has one end fixed to the piezoelectric element and which is reciprocally displaceable in an axial direction by expansion and contraction of the piezoelectric element;

a friction engaging member which comes into frictional engagement with the vibrating member, holds the movable member, and is slidably displaceable with respect to the vibrating member by reciprocal movement of the vibrating member; and a drive circuit which applies a drive voltage to the piezoelectric element, wherein when the movable member is moved forward or backward by only the predetermined minute amount, the drive circuit applies a predetermined voltage to the piezoelectric element in positive and negative directions while slowly changing the voltage so as to prevent slide displacement of the friction engaging member with respect to the vibrating member.

13. A positioning method for positioning a movable member moved by a drive unit so as to maximize a detection output of a position detecting means whose detection output varies corresponding to positions of the movable member, comprising:

wobbling control performed when the detection output is small, in which the movable member is first moved forward by only a predetermined minute amount, then backward by twice the minute amount, again is moved forward by only the predetermined minute amount, and further in proportion to a difference between the detection output when the movable member is first moved forward by the predetermined minute amount and the detection output when the movable member is moved backward; and hill climbing control performed when the detection output is large, in which the movable member is moved in one direction by only a predetermined adjustment amount and when the detection output increases, the movable member is moved again in an identical direction by the adjustment amount.

14. The positioning method according to claim 13, wherein the drive unit comprises:

a piezoelectric element which expands and contracts upon application of voltage;

a vibrating member which has one end fixed to the piezoelectric element and which is reciprocally displaceable in an axial direction by expansion and contraction of the piezoelectric element;

a friction engaging member which comes into frictional engagement with the vibrating member, holds the movable member, and is slidably displaceable with respect to the vibrating member by reciprocal movement of the vibrating member; and a drive circuit which applies a drive voltage to the piezoelectric element, wherein when the movable member is moved forward or backward by only the predetermined minute amount, the drive circuit applies a predetermined voltage to the piezoelectric element in positive and negative directions while slowly changing the voltage so as to prevent slide displacement of the friction engaging member with respect to the vibrating member.

* * * * *